(12) United States Patent
Kotik

(10) Patent No.: US 11,366,173 B2
(45) Date of Patent: Jun. 21, 2022

(54) METHOD OF DETERMINING LIFETIME OF ELECTRICAL AND MECHANICAL COMPONENTS

(71) Applicant: Robert Bosch GmbH, Stuttgart (DE)

(72) Inventor: Mark Kotik, Rochester Hills, MI (US)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 17/091,037

(22) Filed: Nov. 6, 2020

(65) Prior Publication Data

US 2022/0146587 A1    May 12, 2022

(51) Int. Cl.
| | |
|---|---|
| *G01R 31/392* | (2019.01) |
| *G01R 31/367* | (2019.01) |
| *G05B 23/02* | (2006.01) |
| *G01R 31/00* | (2006.01) |
| *G01R 31/382* | (2019.01) |
| *G01R 31/396* | (2019.01) |

(52) U.S. Cl.
CPC ......... *G01R 31/392* (2019.01); *G01R 31/006* (2013.01); *G01R 31/382* (2019.01); *G01R 31/396* (2019.01); *G01R 31/367* (2019.01); *G05B 23/02* (2013.01)

(58) Field of Classification Search
CPC .. G01R 31/392; G01R 31/006; G01R 31/382; G01R 31/396; G01R 31/367; G05B 23/02
See application file for complete search history.

(56) References Cited

U.S. PATENT DOCUMENTS

| | | | |
|---|---|---|---|
| 8,407,018 B2 | 3/2013 | White et al. | |
| 10,072,626 B1* | 9/2018 | Leone | F02N 11/0833 |
| 10,229,552 B2 | 3/2019 | Holtappels et al. | |
| 10,250,039 B2 | 4/2019 | Wenzel et al. | |
| 2011/0241692 A1* | 10/2011 | Akita | G01R 31/3278 324/423 |
| 2013/0241567 A1 | 9/2013 | Boehm et al. | |
| 2013/0278269 A1* | 10/2013 | Steck | G01R 31/3278 324/418 |
| 2016/0011274 A1 | 1/2016 | Morita et al. | |
| 2016/0107590 A1 | 4/2016 | Deshpande et al. | |

FOREIGN PATENT DOCUMENTS

| | | | |
|---|---|---|---|
| CN | 105527576 | | 4/2016 |
| CN | 107656200 A | * | 2/2018 |
| CN | 110008235 | | 7/2019 |
| CN | 111222782 A | * | 6/2020 |
| DE | 10 2010 031 337 | | 1/2012 |
| JP | 2007-195312 | | 8/2007 |
| KR | 20170062739 A | * | 6/2017 |

* cited by examiner

*Primary Examiner* — John C Kuan
(74) *Attorney, Agent, or Firm* — Maginot, Moore & Beck LLP

(57) ABSTRACT

The disclosure is directed to systems and methods by which the lifetime, e.g., remaining life or amount of life used, of variable use items, such as rechargeable batteries, battery relays, vehicles and power tools, can be determined that takes into account the conditions of the use of the item. The systems and methods involve an algorithm that can be described as accumulating points based on the real time utilization of the item, e.g., rechargeable battery, battery relay, vehicle, or power tool, and when an agreed-upon number of points have been accumulated, the item can be considered to be at end of life or end of warranty.

4 Claims, 9 Drawing Sheets

| Load current (A) | Contactor cycles endurance |
|---|---|
| 0.5 | 100000 |
| 5 | 80000 |
| 10 | 75000 |
| 30 | 60000 |
| 50 | 20000 |
| 100 | 10000 |
| 200 | 2500 |
| 500 | 200 |

FIG. 9

| Load current (A) | Contactor cycles endurance | Natural log of cycles |
|---|---|---|
| 0.5 | 100000 | 11.5129 |
| 5 | 80000 | 11.2898 |
| 10 | 75000 | 11.2252 |
| 30 | 60000 | 11.0021 |
| 50 | 20000 | 9.9035 |
| 100 | 10000 | 9.2103 |
| 200 | 2500 | 7.8240 |
| 500 | 200 | 5.2983 |

FIG. 10

| Current | Points per cycle |
|---|---|
| 0.5 | 10.0 |
| 5 | 12.5 |
| 10 | 13.3 |
| 30 | 16.7 |
| 50 | 50.0 |
| 100 | 100.0 |
| 200 | 400.0 |
| 500 | 5000.0 |

METHOD OF DETERMINING LIFETIME OF ELECTRICAL AND MECHANICAL COMPONENTS

TECHNICAL FIELD

The disclosure relates generally to usage of variable use systems, and, in particular, to systems and methods for determining the lifetime of variable use systems.

BACKGROUND

Current methods by which the lifetime, e.g., for warranty purposes, of electrical and mechanical components typically involve merely keeping track of how long the component has been used. For example, battery lifetimes and warranties are generated and agreed upon between the battery supplier and a vehicle manufacturer depend on methods that are separate from the actual utilization of battery system. Historical means of assigning a battery warranty have been based on number of miles/km driven or number of days elapsed since the initial vehicle sale. This method does not take into account how aggressively or tamely the battery system has been utilized. Further, the farther from a Battery Electric Vehicle that a system architecture is designed (closer toward a mild hybrid) the less correlation there is between vehicle age and mileage and longevity of the battery system. A recent advancement has been to utilize amp-hour throughput as a metric by which to define a warranty period. While this is a closer metric by which to define battery life, it still does not account for the type of utilization (abusive utilization or mild utilization) of the battery system.

Current methods by which relay warranties as described by a relay manufacturer is to describe a bin system that indicates the number of on/off cycles of a relay possible with a certain amount of current flowing. The higher the current the flows at the moment of relay opening or closing, the lower the lifetime of the relay contacts. There is currently no means by which to signal the end of warranty or state of health of the relay when the magnitude of the current at open/close is different every time.

Current methods for determining lifetime for warranty purposes for vehicles and power tools typically comprises merely tracking the number of miles in the case of vehicles and tracking the how long the tool was used, e.g., turned on, in the case of power tools. A method of determining the lifetime of vehicles and power tools that takes into consideration the conditions of use would be greatly beneficial.

SUMMARY

According to one embodiment, a method of operating a rechargeable battery of a vehicle includes detecting state of charge swings during operation of the rechargeable battery; determining a first point value for each of the state of charge swings, the first point value being dependent on a magnitude of a swing of the respective state of charge swings; determining a temperature for each of the state of charge swings; determining a second point value for each of the state of charge swings, the second point value being dependent upon a magnitude of the temperature of the respective state of charge swings; determining a battery current for each of the state of charge swings; determining a third point value for each of the state of charge swings, the third point value being dependent upon a magnitude of the battery current of the respective state of charge swings; determining a fourth point value of each of the state of charge swings, the fourth point value being a product of the first point value, the second point value and the third point value of the respective state of charge swings; determining a first score for the rechargeable battery, the first score being a sum of the fourth point values for the state of charge swings; and correlating the first score to a remaining life value for the rechargeable battery.

According to another embodiment, a rechargeable battery system includes a rechargeable battery; a sensor system configured to detect state of charge, a temperature, and a battery current of the rechargeable battery; and a control system configured to receive the state of charge, the temperature, and the battery current from the sensor system. The control system is configured to: detect state of charge swings during operation of the rechargeable battery; determine a first point value for each of the state of charge swings, the first point value being dependent on a magnitude of a swing of the respective state of charge swings; determine the temperature of the rechargeable battery for each of the state of charge swings; determine a second point value for each of the state of charge swings, the second point value being dependent upon a magnitude of the temperature of the respective state of charge swings; determine the battery current of the rechargeable battery for each of the state of charge swings; determine a third point value for each of the state of charge swings, the third point value being dependent upon a magnitude of the battery current for the respective state of charge swings; determine a fourth point value of each of the state of charge swings, the fourth point value being a product of the first point value, the second point value and the third point value of the respective state of charge swings; determine a first score for the rechargeable battery, the first score being a sum of the fourth point values for the state of charge swings; and correlate the first score to a remaining life value for the rechargeable battery.

According to yet another embodiment, a method of determining remaining life of a battery relay includes detecting a current through a relay during each cycle that the relay is closed; determining a cycle endurance value for each cycle, the cycle endurance value being dependent upon the current detected for each respective cycle; assigning a point value to each of the cycles, the point value being a natural log of the cycle endurance value for the respective cycle; and combining the point values for each of the cycles to arrive at a life score for the relay.

According to yet another embodiment, a rechargeable battery system includes a rechargeable battery including a relay; a sensor system configured to detect a battery current through the at least one relay; and a control system configured to receive the battery current from the sensor system. The control system is configured to: determine the battery current through the relay during each cycle that the relay is closed; determine a cycle endurance value for each of the cycles that the relay is closed, the cycle endurance value being dependent upon the battery current through the relay for each of the respective cycles; assign a point value to each of the cycles, the point value being a natural log of the cycle endurance value for the respective cycle; combine the point values for each of the cycles to arrive at a life score for the relay.

BRIEF DESCRIPTION OF THE DRAWINGS

FIG. 9 is a binning table for relay contactors according to the prior art.

FIG. 10 shows the binning table of FIG. 9 with the natural log values of the cycles.

DESCRIPTION

Figure 1:
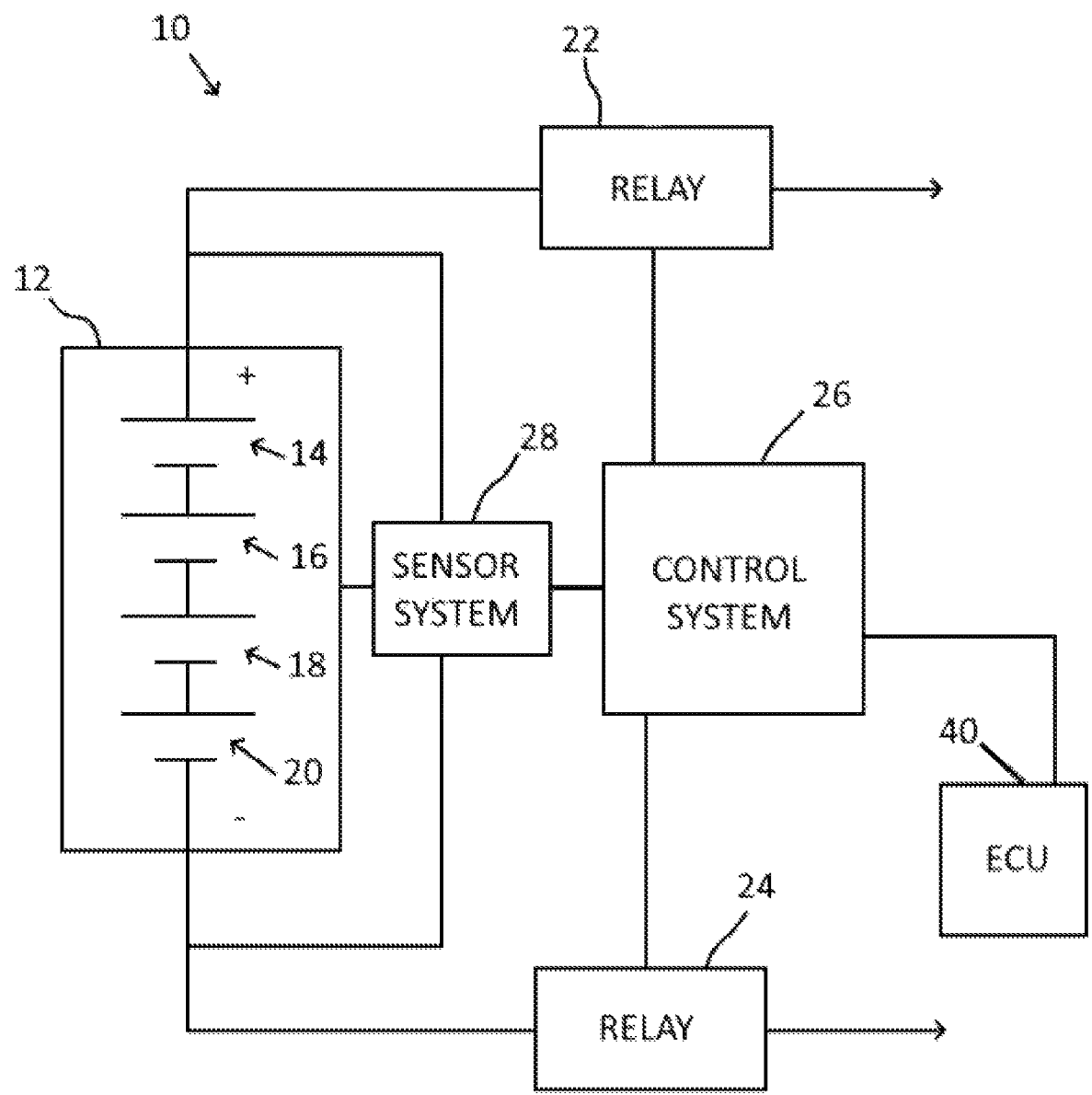
FIG. 1 is a schematic depiction of a battery system in accordance with the present disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

The disclosure is directed to systems and methods by which the lifetime, e.g., remaining life or amount of life used, of variable use items, such as rechargeable batteries, battery relays, vehicles and power tools, can be determined that takes into account the conditions of the use of the item. The systems and methods involve an algorithm that can be described as accumulating points based on the real time utilization of the item, e.g., rechargeable battery, battery relay, vehicle, or power tool, and when an agreed-upon number of points have been accumulated, the item can be considered to be at end of life or end of warranty.

In particular, the point system described herein factors in a variety of usage conditions that are typically already being measured in the system. Combining them to generate a point value during use and accumulating those points until an agreed-upon threshold is attained is an advancement toward defining the end of warranty or end of life period. The proposed point system better reflects the actual usage of the system versus a crude elapsed time, elapsed mileage metrics or that only tracks open/close cycles.

An exemplary embodiment of a battery system 10 in accordance with the present disclosure is depicted in FIG. 1.

The battery system 10 includes a rechargeable battery 12 having a plurality of battery cells 14, 16, 18, 20. Four cells 14, 16, 18, 20 are depicted in FIG. 1 although any suitable number of cells may be used. The battery cells 14, 16, 18, 20 are connected in series. The cells 14, 16, 18, 20 may be also be combined into separate modules. Although a single module is depicted in FIG. 1, any suitable number of modules may be implemented. In one embodiment, the battery 12 is a lithium ion battery, such as are used in electric and hybrid vehicles. In other embodiments, other types of batteries may be used in the system including nickel-metal hydride batteries and lead-acid batteries.

As depicted in FIG. 1, relays 22, 24 are provided to selectively couple the battery to one or more circuits which may include a load and a charging circuit (not shown). The relays 22, 24 are opened and closed to control a flow of a charging current to or a flow of a discharging current from the battery. A first relay 22 is serially connected to a positive electrode of the battery 12, and a second relay 24 is serially connected to a negative electrode of the battery 12.

A battery control system 26 is configured to control the opening and closing of the relays 22, 24. The battery control system 26 includes a controller and electronic storage. The controller may be a self-contained, dedicated mini-computer having a central processor unit (CPU). The electronic storage comprises a memory configured to store data and instructions for access by the controller.

The control system 26 is configured to monitor various battery usage parameters of the battery via a sensor system 28. The sensor system 28 is configured to detect various battery usage parameters, such as temperature, voltage, current, and state of charge (SOC) of the battery, using sensors and direct or indirect methods. In particular, the sensor system The battery usage parameters may be detected using various sensors, such as temperature sensors, voltage sensors, current sensors, and the like, as are known in the art. The sensor system 28 detects the battery usage parameters and transmits them to the battery control system 26.

During operation of the battery system, battery temperature, voltage and current are monitored by the control system. The control system is configured to use the battery temperature, voltage and current to estimate the SOC of the battery and/or the battery cells. The SOC may be estimated in any suitable manner as known in the art, such as by modeling the battery system with an equivalent circuit.

In accordance with the present disclosure, the control system 26 is also configured to estimate the remaining life and/or life used of the battery system based on battery usage parameters, such as state of charge swing, battery temperature, battery current, time that battery is idle, and state of charge. In particular, values for the battery usage parameters are correlated to predetermined weights and/or multipliers to arrive at a point value, or score, which reflects the actual usage of the battery system. The score can be compared to a predetermined threshold value for battery life to determine where the battery is at in its life cycle. When the life score exceeds the threshold, it is determined that the battery has reached its end of life or end of warranty.

The predetermined threshold score or point value for battery life can be any number. It is typically a value that has been agreed upon with the customer. For example, it can be agreed with a customer that a battery will reach end of life/warranty once it accumulates 1,000,000 points—or any other agreed-to number. This number—which can be arbitrary—will factor into the magnitude of the individual point weights and multipliers selected for the battery usage parameters utilized to determine the score.

In one embodiment, the lifetime score is based on state of charge swings of the battery. An exemplary formula for calculating the lifetime score based on state of charge swings is as follows:

$$\Sigma(S*To*C)$$

where:
- S=the state of charge swing points (based on magnitude of the SoC swing)
- To=cell operating temperature during the SoC swing (multiplier)
- C=current, based on the peak or RMS current during the SoC swing (multiplier)

The variables S, To and C are weights and/or multipliers having values which are dependent upon their corresponding parameters. A description of how the weights or multipliers used for the battery usage parameters S, To and C is provided below. Each of the variables can be described graphically via curves or via tables. Generic curves depict what is happening in the battery based on physics and historical testing. A very reliable set of curves/tables may be generated for a particular cell chemistry based on a wide set of tests that also factor in aging testing.

S, the state of charge swing, is a key determinant in the lifetime of a battery. It can be determined in real time by noting the peaks and troughs of the SoC during any given segment of a drive cycle and is indicated by the current switching from positive to negative or vice versa. Swings can be miniscule—from hundredths of a percent to several percentage points. Each swing must be accounted for and its point value accumulated (and appropriately multiplied with the multipliers).

Figure 2:
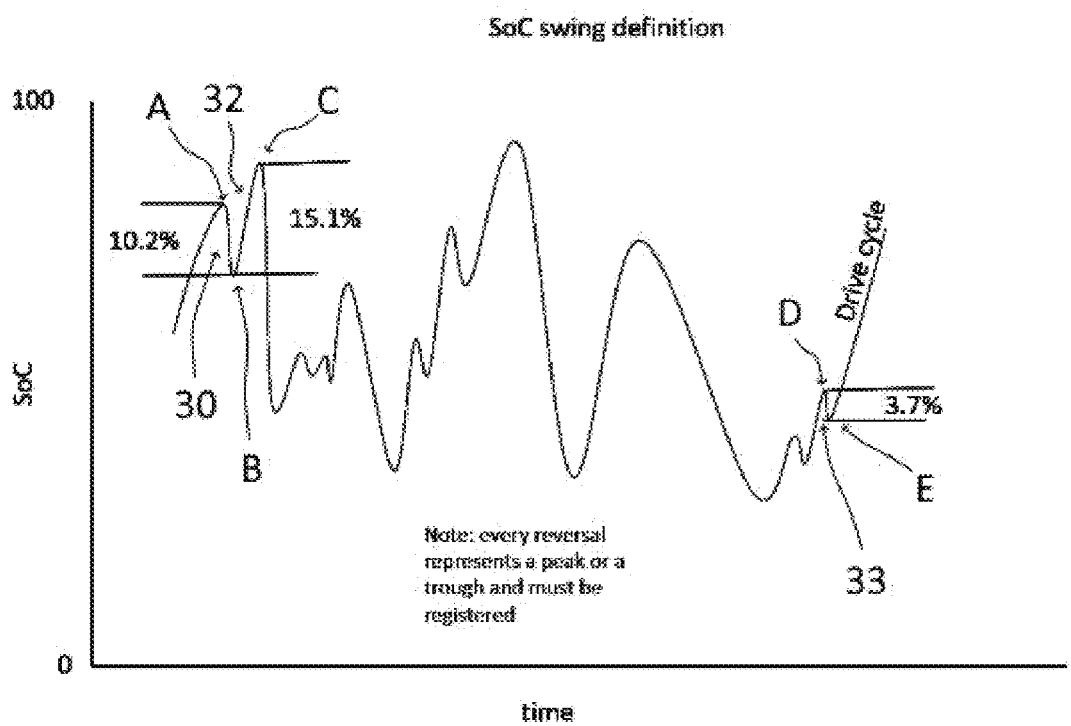
FIG. 2 is a graph showing the state of charge (SoC) swings during a drive cycle of a battery of a battery system, such as depicted in FIG. 1.

An example curve showing the state of charge during a drive cycle is depicted in FIG. 2. Swings are indicated with each peak and trough. In one embodiment, the swing is represented by a percentage change between adjacent peaks and troughs. For example, swing 30 in FIG. 2 indicates a 10.2% swing from peak A to trough B, and swing 32 in FIG. 2 indicates a 15.1% swing from trough B to peak C. Swings can be miniscule as evidenced by swing 33 indicating a 3.7% swing from peak D to trough E. Each swing must be identified and a corresponding point value assigned to it.

Figure 3:
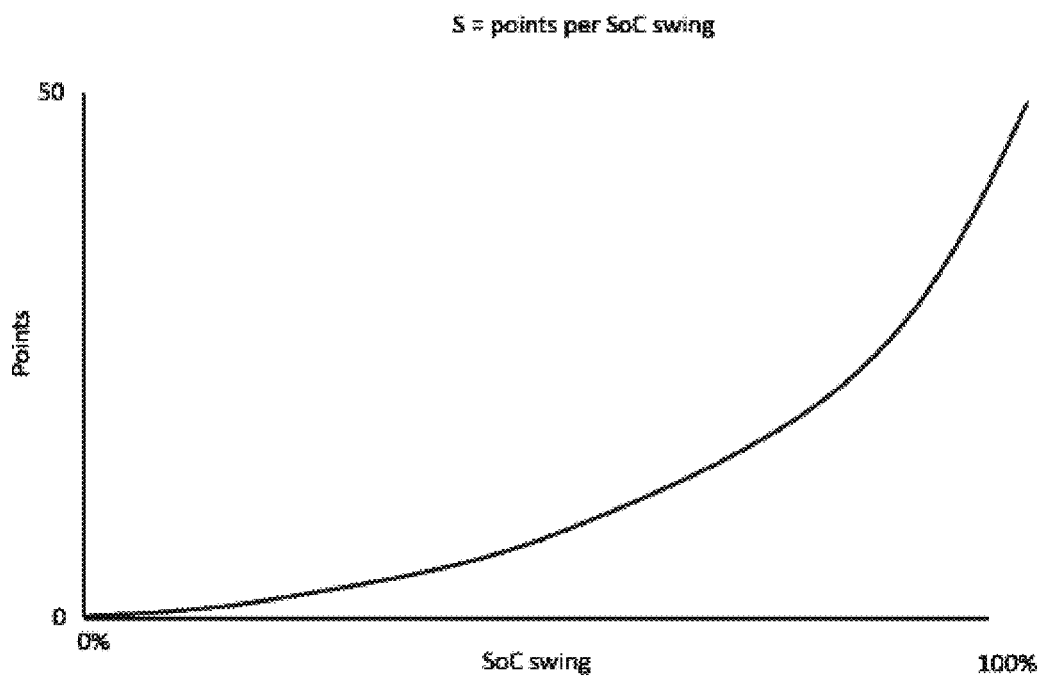
FIG. 3 is an exemplary points curve for the SoC swings, such as depicted in FIG. 2.

FIG. 3 depicts an exemplary curve showing the point values which may be assigned to each swing based on the swing percentage. It is generally a second order polynomial between SoC swing percentage and the number of points. Note that the number of points on the vertical scale is for example only. The actual point value would be based on the total point value that defines end of warranty or end of life, and may be derived in any suitable manner.

Figure 4:
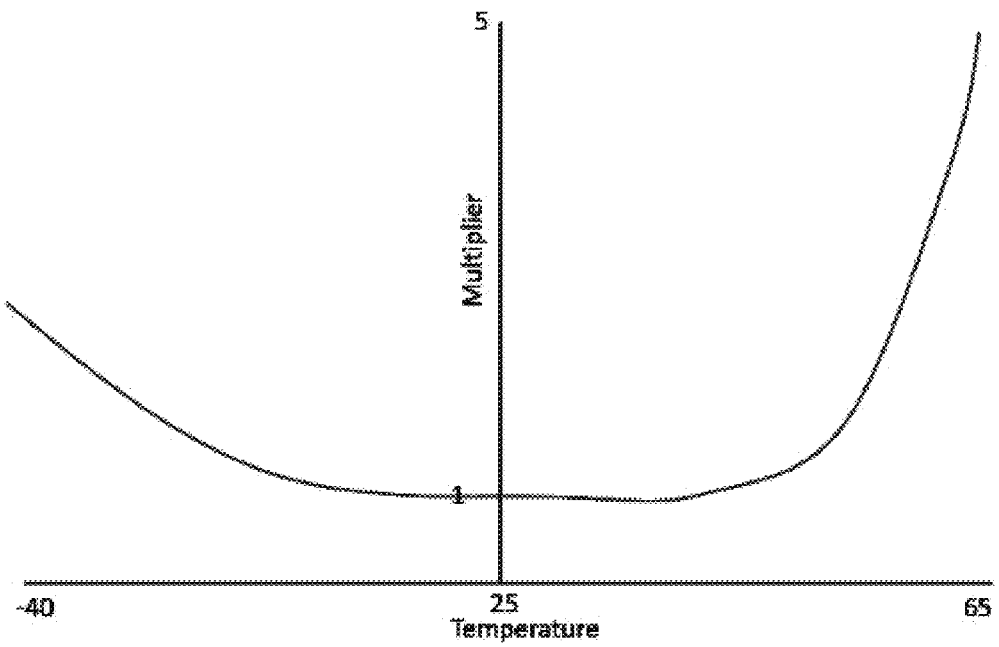
FIG. 4 is an exemplary points curve for the battery temperature of the battery system of FIG. 1 during a SoC swing such as depicted in FIG. 2.

The variable To may be considered a multiplier by which the point value for the SOC swing is multiplied. Battery cells generally have an operating temperature range defined where they can maximize their lifetime. Outside of this temperature range, the lifetime of the batteries is reduced relative to the temperature range. This multiplier is utilized in order to magnify the point value of an SoC swing if the operating temperature of the battery during this SoC swing is outside of the optimal range. In the optimal temperature range the multiplier is 1 and therefore not a factor. An example of a graph/table of this multiplier is depicted in FIG. 4. The vertical scale is arbitrary and the actual multiplier and shape of the curve is heavily dependent on the chemistry and its optimal temperature range.

Figure 5:
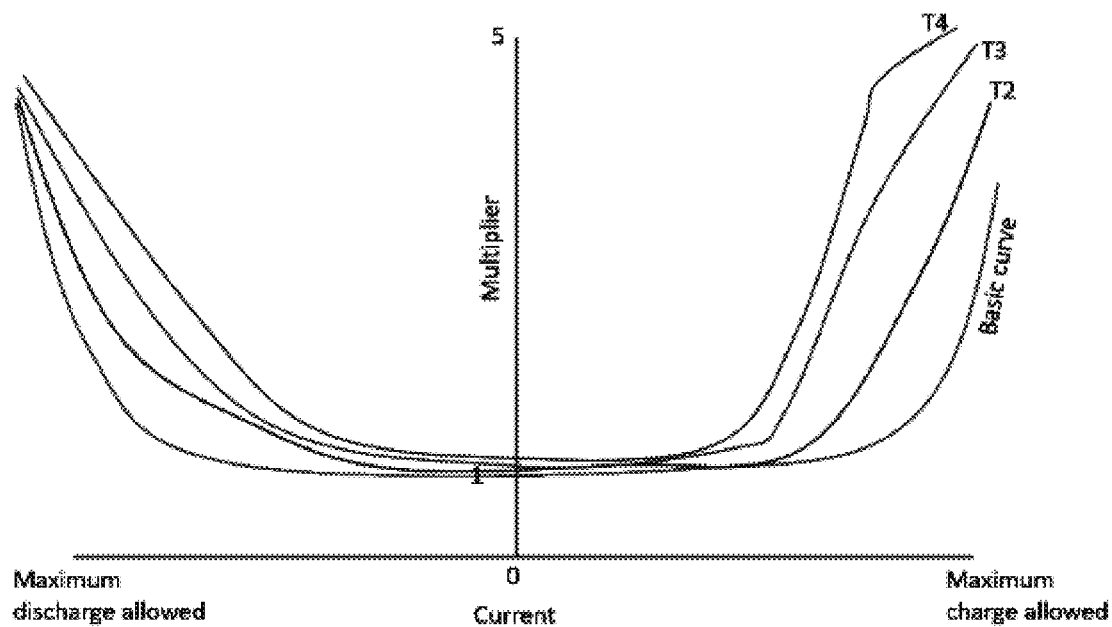
FIG. 5 is an exemplary points curve for the battery current of the battery system of FIG. 1 during a SoC swing such as depicted in FIG. 2.

The variable C is a multiplier based on the detected current through the battery. The current can be the peak current during SoC swing or RMS, for example. The magnitude of the current has implication on the lifetime of the battery as the current density at the interface layers of the battery electrodes can be impacted and lead to a faster degradation of the microscopic interfaces. Therefore, the magnitude of the current acts as a multiplier to the SoC swing to more accurately portray the impact to the microscopic layers of the battery pack. In the plot depicted in FIG. 5 there is a basic curve that can be used plus some additional curves that factor in the cell temperature. If these additional temperature-based curves are used, the prior metric—the To—can be eliminated in favor of the current vs. temperature multiplier shown below. There would certainly be more temperature curves to represent either actual temperatures or ranges. Note that the horizontal scale shows "maximum" of the charge/discharge allowed. This accounts for the degradation of the battery over time and its ability to deliver a maximum current that as compared to what was possible at the beginning of life.

During operation, the control system is configured to determine or calculate a point value for each SoC swing that is a product of the swing point value, the To multiplier and the C multiplier for the respective SoC swing. The point value for each SoC swing is then summed with the point values for each previous SoC swing in order to maintain a running score that represents the battery usage represented by the SoC.

The control system may also be configured to take idle time into consideration in determining the overall lifetime score for the battery. For example, a first score may be derived from the battery usage indicated by the state of charge. A second score may be derived from the idle time conditions, such as duration of idle time, battery temperature during idle times and SoC during idle times. An exemplary formula for generating the overall battery lifetime score is as follows:

$$\Sigma(S*To*C)+\Sigma(d*Ti*H)$$

where:
- S=the state of charge swing points (based on magnitude of the SoC swing)
- To=cell operating temperature during the SoC swing (multiplier)
- C=current, based on the peak or RMS current during the SoC swing (multiplier)
- d=duration (hours or days) of key-off idle time. This is a proxy for calendric aging
- Ti=cell temperature during the idle time (multiplier)
- H=SoC during the idle time (multiplier)

The variables S, To and C may be determined as described above. A description of how the weights or multipliers used for the battery usage parameters d, Ti and H is provided below. As noted above, each of the variables can be described graphically via curves or via tables. Generic curves depict what is happening in the battery based on physics and historical testing. A very reliable set of curves/tables may be generated for a particular cell chemistry based on a wide set of tests that also factor in aging testing.

Figure 6:
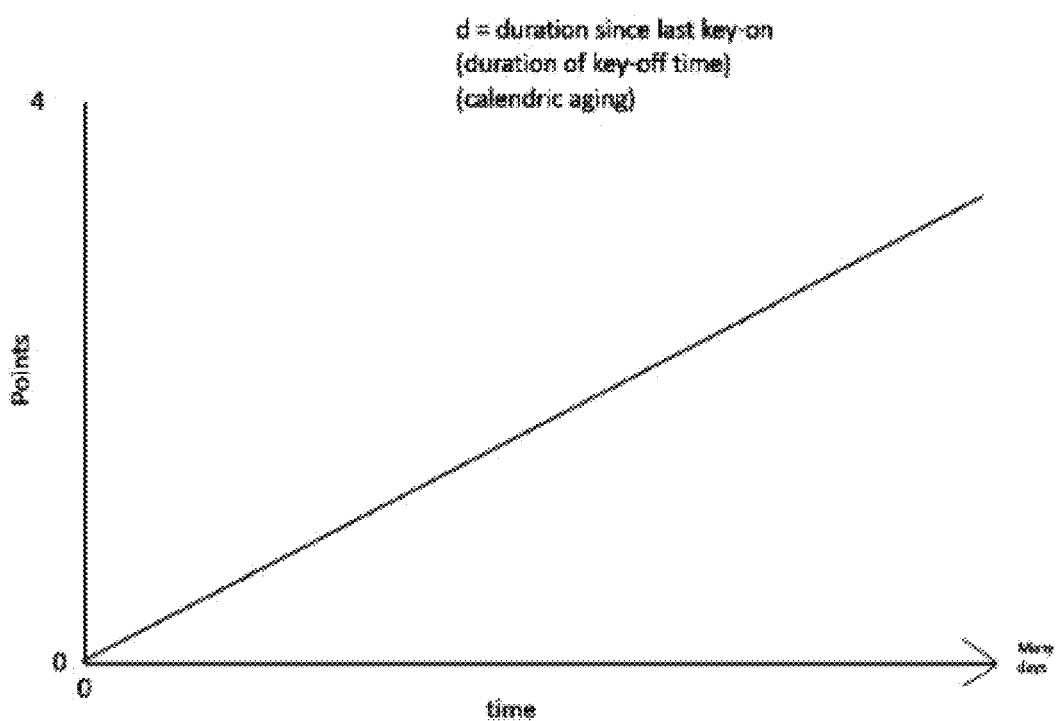
FIG. 6 is an exemplary points curve for the idle time duration of a battery system such as depicted in FIG. 1.

The variable d (duration) accounts for the calendaric aging of the battery based purely on the passage of time. Idle time duration refers to the amount of time that passes while the battery is in an off state, e.g., the vehicle key is in the off position. The key-off state of the vehicle can be monitored by the vehicle control system (ECU 40, FIG. 1). While on the whole this is a small factor relative to the impact of actual battery usage, it does factor in when the vehicle is not in use—particularly at high temperatures where self discharge is a factor. An exemplary points curve is depicted in FIG. 6. The idle time can be tracked in days, hours or other duration metric. This is generally a linear function.

Figure 7:
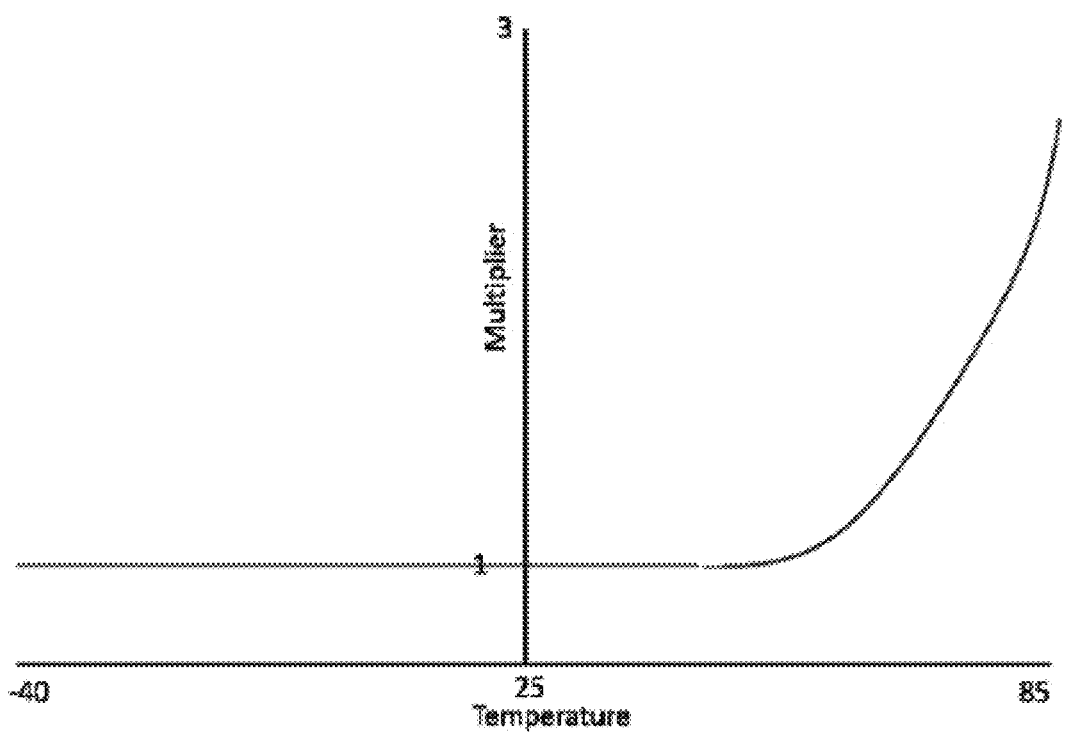
FIG. 7 is an exemplary points curve for the battery temperature during an idle time of a battery system, such as depicted in FIG. 1.

The variable Ti is a multiplier based on the battery temperature during the idle times. An exemplary points curve for the idle time battery temperature is depicted in FIG. 7. During the battery idle time, chemical reactions continue to occur and are accelerated at higher temperatures based on the Arrhenius equation. This multiplier represents the faster calendric aging that occurs during idle time.

Figure 8:
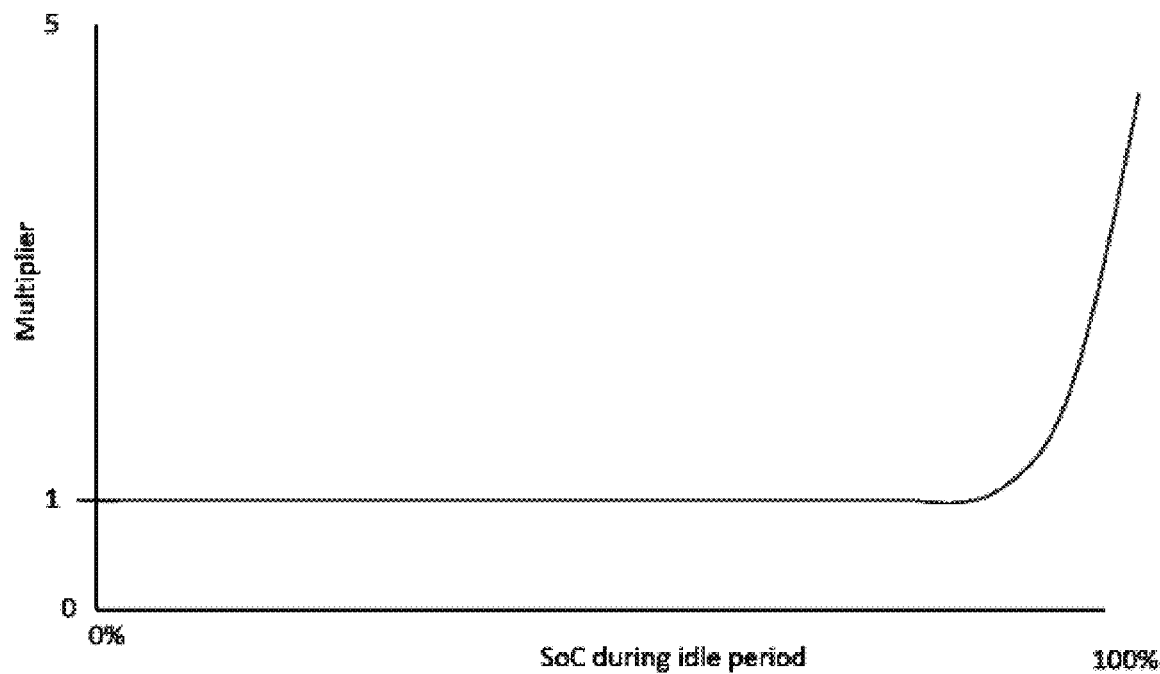
FIG. 8 is an exemplary points curve for the battery SoC during an idle time of a battery system, such as depicted in FIG. 1.

H is a multiplier based on the SoC of the cells. An exemplary points curve for the variable H is depicted in FIG. 8. Cells stored at high SoC degrade at a faster rate due to the high voltage potential across the electrodes and the electrolyte. This multiplier accounts for this scenario to increase the point value of the idle time when the cell SoC is high and degradation occurs at a faster rate. Unless otherwise noted, the point values used in the point curves are arbitrarily selected to represent the actual conditions faced by the battery during idle times, and may be derived in any suitable manner.

Idle times for the vehicle/battery are identified and point values for the idle time duration are determined by the control system, e.g. by using the point curve for the variable d depicted in FIG. 6. The temperature multiplier Ti and SoC multiplier H for each identified idle time are also determined, e.g., by using the point curves depicted in FIGS. 7 and 8, respectively. The control system is configured to determine or calculate a point value for each idle time that is a product of the duration, the Ti multiplier and the H multiplier for the respective idle time. The point value for each idle time is then summed with the point values for each previous SoC swing in order to maintain a running score that represents the battery conditions during idle times of the battery.

The running score representing battery usage conditions (i.e., the first score mentioned above) and the running score representing idle time conditions (i.e., the second score represented above) are combined by the control system to arrive at an overall lifetime score for the battery. The running scores may be stored in a dedicated location in memory and updated for each SoC swing and idle time of the battery.

The overall lifetime score for the battery may then be used to determine the remaining life and/or the amount used. For example, the control system may be configured to compare the overall lifetime score to a predetermined lifetime threshold score. The percentage difference between the overall score and the threshold score may then be correlated to the amount of life remaining in the battery. The predetermined threshold score may be selected in any suitable manner and is typically used to indicate when the expected life of the battery and/or warranty of the battery is at an end.

The previous example described an embodiment in which battery usage and idle time conditions are used to generate a lifetime score for the battery of the battery system. A similar methodology may be used to generate a lifetime score for other components of the battery system, such as the relays. In one embodiment, the point system accumulates points based on the current flow at the moment a relay is opened/closed. The higher the current flow the higher the point value ascribed to that event. When a predetermined number of points have been accumulated it may be considered the end of the warranty or end of life for the relay.

Relay manufacturers typically provide a binning table that describes their expected lifetime of a relay based on the number of cycles possible at a given current flow. FIG. 9 depicts an example of such a table. From this table it can be seen that if the contactor is opened/closed into a low current flow of 0.5 A or below, the lifetime can be expected to be 100,000 cycles. However, the vehicle manufacturer indicates that the currents may be spiking during such event due to conditions external to the battery pack. There is no way to consider the guaranteed lifetime if—for example—there are occasional events that occur at higher currents.

Figures 11, 12:
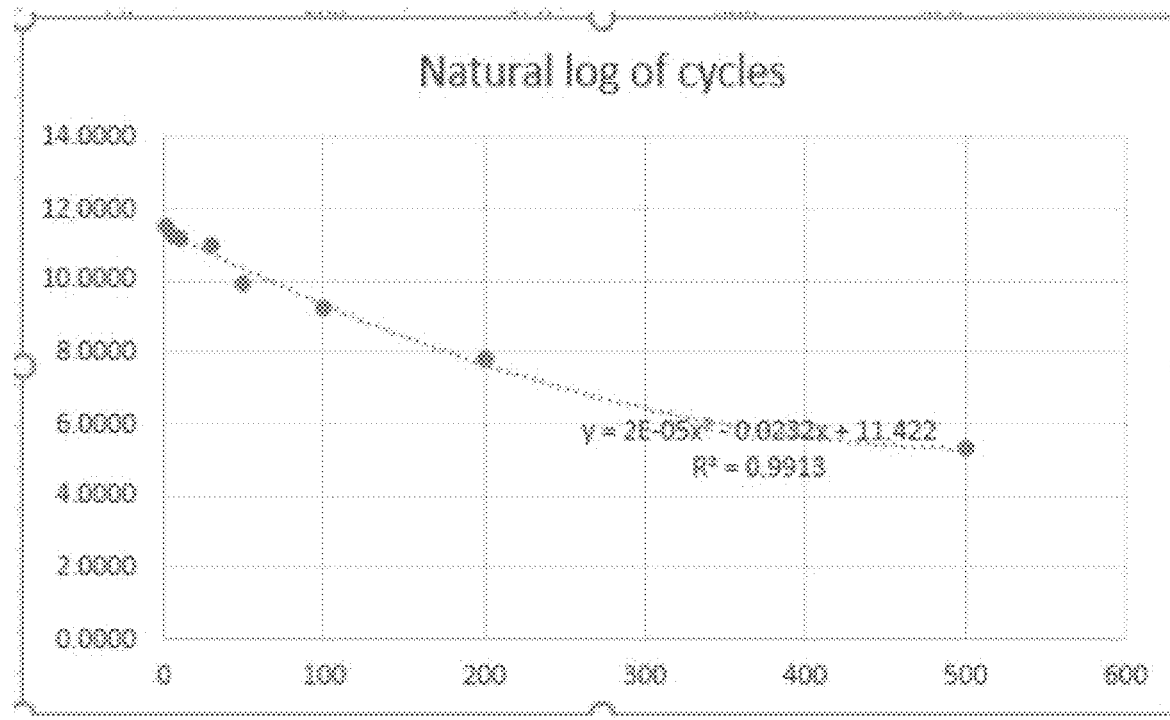
FIG. 11 is a graph of the natural log cycles vs. the number of cycles of the binning tables of FIGS. 9 and 10.
FIG. 12. is a binning table that divides the cycles of the binning table of FIG. 9 by 1,000,000 to show points per cycle.

By using a point system, the aforementioned issue can be resolved. By converting the cycle endurance value into its own natural log value or into a base 10 log value, it can be seen that the resultant curve has a very high correlation to a second order polynomial and is therefore very predictable. This means that for a given current at the open/close of a relay, a point value can be assigned and accumulated. A binning table showing the natural log value of the contactor cycle endurance values (See, FIG. 9) is depicted in FIG. 10. A graph of the natural log of cycles (Y-axis) vs. the number of cycles is depicted in FIG. 11.

Figure 13:
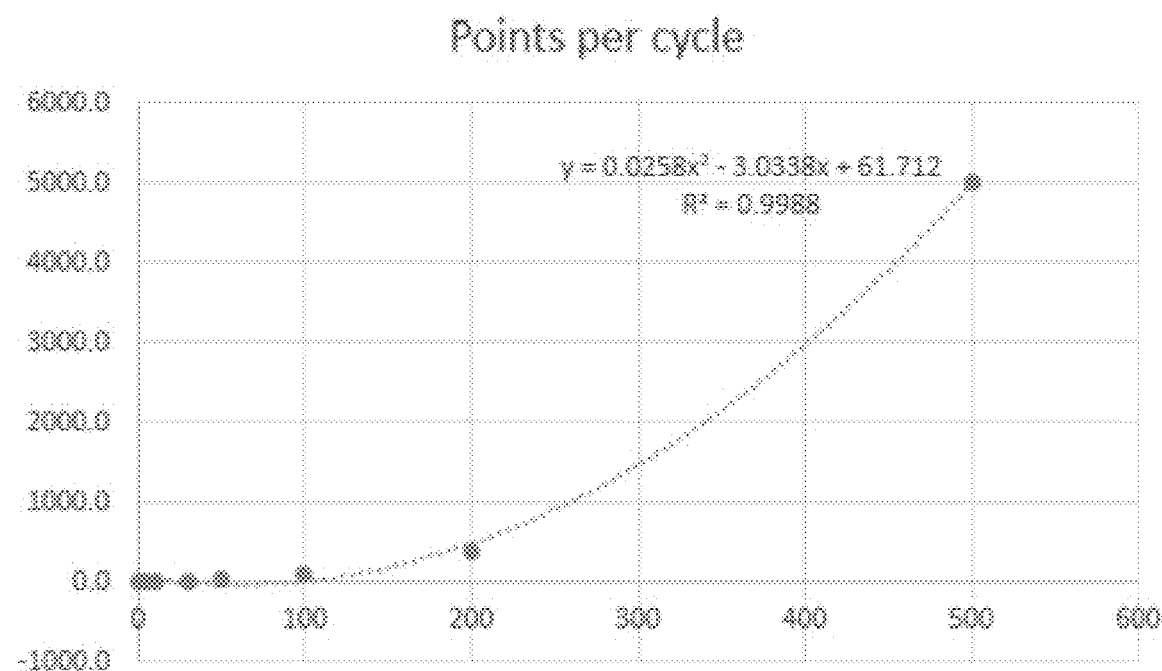
FIG. 13 is a graph of the points per cycle of the binning table of FIG. 12.

In a particular case, assuming that 1,000,000 points are to be the demarcation at which the contactor warranty or lifetime ends, a table can be generated that divides the previous table's cycle count into 1,000,000 points. Such a table is depicted in FIG. 12. From here, plotting the points table results in a highly correlated 2nd order polynomial, as depicted in FIG. 13, where current is on the horizontal axis and points assigned for opening/closing the contactor at the current is the vertical axis. Using the resultant polynomial curve, if a vehicle commands the battery pack to open the contactor when there are 320 A flowing, the point value for that event would be 1733 points. Using this aforementioned methodology and continually adding the points to a running tally provides a more accurate and reliable reporting of the contactor life in a vehicle.

Figure 14:
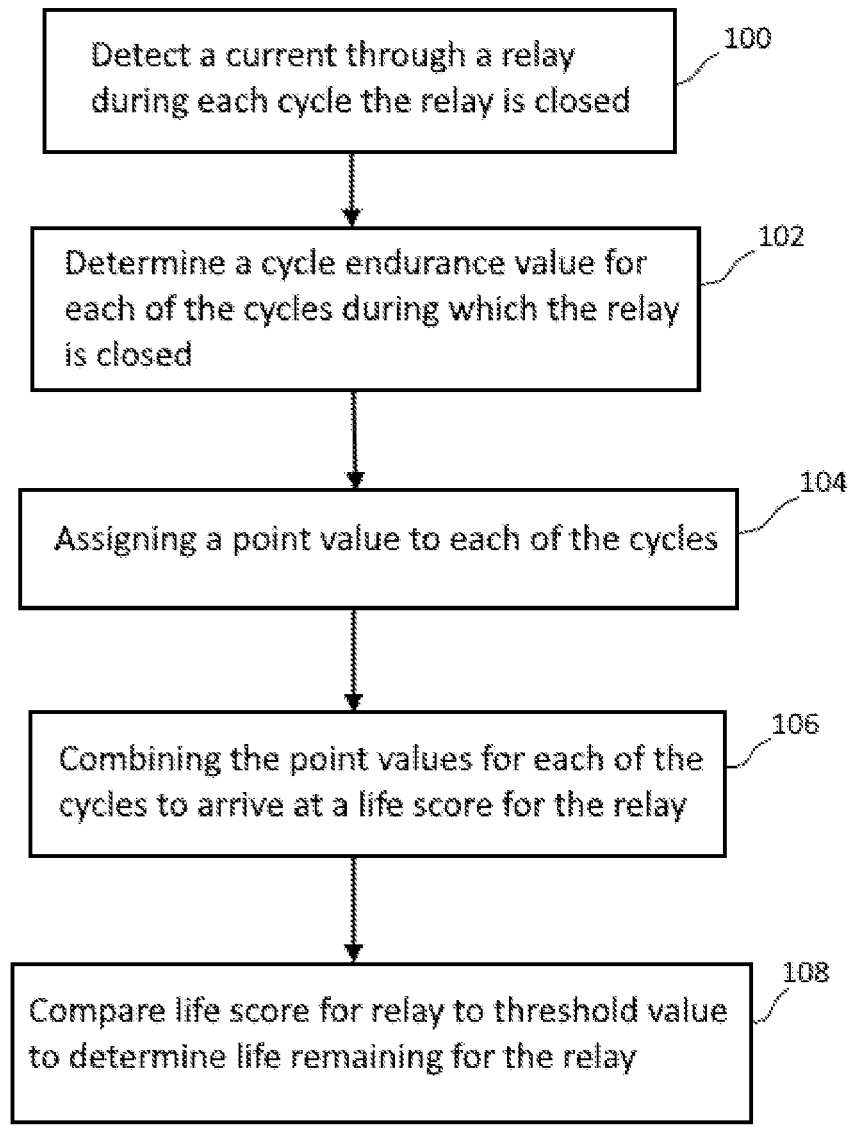
FIG. 14 is a flowchart of a method of determining remaining life of a battery relay.

FIG. 14 depicts an embodiment of a method of determining remaining life of a battery relay based on the point system described above. According to the method, a current through a relay is detected during each cycle the relay is closed (block 100). A cycle endurance value is then determined for each of the cycles during which the relay is closed (block 102). As discussed above, the cycle endurance value is dependent upon the current detected for each a respective cycle. A point value is assigned to each of the cycles (block 104). The point value is a natural log of the cycle endurance value for the respective cycle. The point values for each of the cycles are then combined to arrive at a life score for the relay (block 106). The life score for the relay is then compared with a predetermined threshold value to determine the life remaining for the relay (block 108).

Another instance that may benefit from the points system described herein is determining the lifetime of a vehicle, and in particular, the vehicle engine. The engine life has typically been determined based on mileage alone. The present disclosure proposes a system that takes into account coolant temperature, engine rotations per minute (RPMs), engine load (i.e., torque), and oil life. The vehicle includes sensors for detecting coolant temperature, RPMs, engine torque and oil life. A control system for the vehicle receives the values continuously as inputs from the sensor system and can process the inputs to maintain a running score. In one implementation the multiplier of each of those metrics would result in—for example—a number of points per second of usage of the vehicle.

Coolant score for example can be a non-factor (e.g., a multiplier of 1) when the coolant temperature is in a normal operating range. If the coolant temperature exceeds the normal operating range, the score for the coolant temperature can increase to reflect the toll such conditions can have on the engine. Similarly, for the RPMs, engine torque and oil life, when the variable is within a normal operating range or below threshold(s), the weight/score for the variable will be lower than when the variable is outside the normal operating range or above a threshold value. The exact weight/score and the corresponding threshold values can be arbitrarily selected so as to reflect the amount of life that is used based on the actual usage of the vehicle. For example, at cold temperatures, a driver who on a cold start floors the accelerator while towing would incur a large number of points because such condition results in rapid engine wear. At mild temperatures, a driver who does not drive aggressively would incur few points because all conditions have a low multiplier.

Another system that could benefit from the use of the points tracking system described herein is power tool systems. The life of a power tool is often based on the amount of time used, e.g., hours of usage. The present disclosure proposes a system that takes into account motor temperature, motor torque, current flow through the windings of the motor, and motor RPM. The power tool includes sensors for detecting these parameters. A control system for the power tool receives the values continuously as inputs from the sensor system and can process the inputs to maintain a running score for the power tool or for the motor of the power tool. The exact weight/score and corresponding threshold values can be arbitrarily selected so as to reflect the amount of life that is used based on the actual usage of the tool. In one implementation the multiplier of these metrics would result in—for example—a number of points per 1/10th of a second of usage. For example, if a user stalls the motor during a drilling or screwing operation and the current spikes and the winding temperature rises rapidly, there would be a high number of points based on the duration that the user keeps the trigger depressed. If a user is drilling into soft wood and the motor isn't strained, there would be very few points accumulated during such an operation While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of determining remaining life of a battery relay, the method comprising:
   detecting a current through a relay during each cycle that the relay is closed;
   determining a cycle endurance value for each of the cycles during which the relay is closed, the cycle endurance value being dependent upon the current detected for a respective cycle;
   assigning a point value to each of the cycles, the point value being a natural log of the cycle endurance value for the respective cycle; and
   combining the point values for each of the cycles to arrive at a life score for the relay.

2. The method of claim 1, further comprising:
   comparing the life score for the relay to a predetermined threshold value; and
   determining a life remaining for the relay based on the comparison.

3. A rechargeable battery system comprising:
   a rechargeable battery including a relay;
   a sensor system configured to detect a battery current through the relay; and
   a control system configured to receive the battery current from the sensor system, the control system being configured to:
      determine the battery current through the relay during each cycle that the relay is closed;
      determine a cycle endurance value for each of the cycles during which the relay is closed, the cycle endurance value being dependent upon the battery current through the relay for a respective cycle;
      assign a point value to each of the cycles, the point value being a natural log of the cycle endurance value for the respective cycle; and
      combine the point values for each of the cycles to arrive at a life score for the relay.

4. The system of claim of claim 3, wherein the control system is further configured to:
   compare the life score for the relay to a predetermined threshold value; and
   determine a life remaining for the relay based on the comparison.

* * * * *